(12) United States Patent
Musat et al.

(10) Patent No.: US 7,684,162 B2
(45) Date of Patent: Mar. 23, 2010

(54) LEAKAGE CURRENT PROTECTION DEVICE

(75) Inventors: Rodica Musat, Haddonfield, NJ (US);
Frank A. Raneiro, Pitman, NJ (US);
Thomas H. Rooney, Jr., Oaklyn, NJ (US)

(73) Assignee: Magnetic Metals Corporation, Camden, NJ (US)

( * ) Notice: Subject to any disclaimer, the term of this patent is extended or adjusted under 35 U.S.C. 154(b) by 169 days.

(21) Appl. No.: 12/052,185

(22) Filed: Mar. 20, 2008

(65) Prior Publication Data

US 2008/0232007 A1     Sep. 25, 2008

Related U.S. Application Data

(60) Provisional application No. 60/896,193, filed on Mar. 21, 2007.

(51) Int. Cl.
*H02H 3/00* (2006.01)
*H02H 9/08* (2006.01)
*H02H 1/00* (2006.01)

(52) U.S. Cl. .............................. 361/42; 361/43; 361/44; 361/45; 361/46; 361/78; 361/86; 361/87; 361/113

(58) Field of Classification Search .............. 361/44–46
See application file for complete search history.

(56) References Cited

U.S. PATENT DOCUMENTS

| | | | | |
|---|---|---|---|---|
| 3,786,356 | A | * | 1/1974 | MacPhee ...................... 361/45 |
| 4,150,411 | A | * | 4/1979 | Howell ......................... 361/45 |
| 4,685,022 | A | * | 8/1987 | Nichols et al. ................ 361/44 |
| 4,881,989 | A | | 11/1989 | Yoshizawa et al. |
| 4,931,894 | A | * | 6/1990 | Legatti ........................ 361/45 |
| 5,113,736 | A | | 5/1992 | Meyerle |
| 5,245,904 | A | | 9/1993 | Meyerle |
| 5,917,686 | A | * | 6/1999 | Chan et al. ................... 361/42 |
| 6,311,597 | B1 | | 11/2001 | Schroth et al. |
| 6,941,790 | B2 | | 9/2005 | Rooney, Jr. et al. |
| 7,114,365 | B2 | | 10/2006 | Rooney, Jr. et al. |
| 7,359,167 | B2 | * | 4/2008 | Elms ............................ 361/42 |
| 7,375,935 | B2 | * | 5/2008 | Chan et al. ................... 361/42 |

* cited by examiner

*Primary Examiner*—Albert W Paladini
*Assistant Examiner*—Dharti H Patel
(74) *Attorney, Agent, or Firm*—Duane Morris LLP

(57) ABSTRACT

A leakage current protection device with a single laminated magnetic core transformer that is formed by punch pressing an amorphous metal material, or a nanocrystalline soft metal material, in a high punch velocity press to form the ring laminations for the magnetic core. In a ground fault circuit interrupter, the single laminated magnetic core transformer serves as the input sensor for both the current imbalance detection circuitry and the low impedance ground fault protection circuitry.

16 Claims, 2 Drawing Sheets

LEAKAGE CURRENT PROTECTION DEVICE

CROSS REFERENCE TO RELATED APPLICATION

This application claims the priority of U.S. Provisional Patent Application Ser. No. 60/896,193, filed Mar. 21, 2007.

BACKGROUND OF THE INVENTION

1. Field of the Invention

The invention relates to leakage current protection devices such as ground fault circuit interrupters. More particularly, a leakage protection device is provided that can operate using one transformer, with one magnetic core, to sense continuously both for current imbalances and low impedance ground faults.

2. Prior Art

Leakage current protection devices protect persons from electric shock hazards by sensing when current conditions on a load circuit depart from nominal. When the conditions depart sufficiently, the protective circuit decouples the load circuit from the power mains, normally requiring a reset to return to a normal state. Leakage current protection devices may be provided in domestic power outlets, such as the type of device known as a ground fault circuit interrupter (sometimes abbreviated "GFCI"), or in an appliance or in powered equipment generally.

Requirements for GFCI circuits are defined in UL standard 943A. A GFCI typically comprises a first differential transformer and a second grounded-neutral transformer. There are sensed conditions that each employ a separate transformer and magnetic core. Two primary windings of the two transformers are defined by the line and neutral power line conductors. Secondary windings on the two cores are coupled to an amplifier and switching circuit.

The differential transformer can be made of ring-shaped laminations, each lamination is stamped from a Ni—Fe sheet of 0.006 to 0.014 inches thickness. The laminations are stacked and enclosed in an electrically non-conductive encasement. The stack of laminations is termed a magnetic core or a ring core.

The power line and neutral conductor paths pass through the lumen of the ring core. The differential transformer ring core is wound with a conductor from several hundred to several thousand turns, the ring core with these windings is mounted in a plastic bracket with pins for terminations, and mounted on a circuit board.

In nominal current conditions, the line and neutral conductors carry equal and opposite currents. The differential transformer responds to an imbalance in current on the line and neutral power lines coupled through the core. A trigger signal is developed and coupled to an operator that latches open a set of contacts and thereby decouples the load circuit, including the GFCI, from the power mains.

The grounded neutral transformer in the device typically comprises a ferrite ring core. The ferrite core is wound with a secondary winding of approximately 150 to 300 turns. The grounded neutral transformer can be mounted separately or in a pair with the differential transformer in plastic brackets carrying pins for terminations.

Grounded-neutral ferrite core transformers use a dormant oscillator approach. The neutral conductor passes through the ferrite core. When resistance between neutral and ground becomes less than 2 ohms at the load side, oscillation at the ground-to-neutral transformer induces a voltage in the power line hot line and neutral conductors. Current then flows between the neutral and ground. That current represents a current imbalance and is detected by the differential core. This triggers the contacts to open and decouples the load circuit from the power mains.

Core materials such as ferrite and Ni—Fe alloys are conventionally chosen for inductor and transformer cores due to their good magnetic permeability coupled with relatively limited electrical conductivity. If electrical conductivity is high, changing magnetic flux leads to eddy currents that dissipate power due to resistive heating, which is undesirable.

A typical circuit for such a single phase GFCI as described is illustrated in FIG. 1, labeled "prior art," and has two transformers, i.e., two functionally and structurally distinct magnetic cores. Referring to the drawing, line conductor 90 and neutral conductor 92 are coupled at the POWER SOURCE to a potential difference couple load current to and from the LOAD. Unless there is a circuit anomaly, the line and neutral currents are equal and opposite in conductors 90, 92, and are isolated from ground by a high impedance. The line and neutral conductors pass through differential transformer 111 and grounded neutral transformer 113 from the POWER SOURCE connections, for example a 120 volts ac line to the load.

A current from unequal line and neutral current levels induces a current in the secondary winding of the differential transformer 111. A voltage is thereby coupled to the input of amplifier 115. The input voltage is amplified and coupled to a contact control 117, which can include a threshold detector coupled to drive a solenoid (not shown) to open the contacts.

Differential transformer 111 typically comprises a high permeability ring core 111a and a secondary winding 111b of many turns, typically over a thousand turns. Assuming one turn for the passage of the line or neutral conductor, the transformer turns ratio is 1:1000 (or greater), to develop a current imbalance voltage of a reasonable magnitude for application to an amplifier and/or threshold detector. The grounded neutral transformer 113 has a ferrite ring core 113a and secondary winding 113b with a turns ratio typically in the range from 1:150 to 1:300.

A current imbalance between the line and neutral conductors passing through the differential transformer produces a signal voltage across secondary winding 111b, which signal is proportional in magnitude to the magnitude of the detected current imbalance. This voltage is the input to AMPLIFIER 115, which amplifies the voltage signal and produces an "open contacts" signal to CONTACT CONTROL 117, which is typically specified to open the normally-closed line contacts 101 for threshold current imbalances of 5 mA, 10 mA, 30 mA, or greater, over a temperature range of −35 C to +80 C, depending on the specific GFCI model.

In the GFCI of FIG. 1, two current situations are sensed with two respective transformers. U.S. Pat. No. 4,150,411 discloses a single transformer GFCI, but in that device the single transformer is arranged to use the single transformer alternately to sense current imbalance and low ground-neutral impedance, one at a time. For this purpose, the single ferromagnetic transformer is connected to a switching circuit that alternates between sensing current imbalances and low impedance ground faults.

Other types of leak current protection devices are known that sense current imbalance with a differential transformer, and lack a second transformer because ground faults are not sensed. For example, an appliance leakage current interrupter (ALCI) and an equipment leakage current interrupter (ELCI), which typically are mounted in the equipment housing or cabinet, typically have a differential transformer but not a grounded neutral transformer. These devices are distinct from GFCI devices that sense for both current imbalance and ground fault conditions.

SUMMARY OF THE INVENTION

It is an object of the present invention to provide a GFCI wherein a single transformer is used to sense both for line-neutral current imbalance and low ground-neutral impedance, simultaneously and continuously.

Thus, it is an aspect to serve the two sensing functions of the separate transformers described above with one transformer that is structured and configured to continuously sense for current imbalance and low impedance ground faults.

It is another object of the present invention to provide a leak current protection device wherein the differential transformer is formed from a stack of ring laminations punch pressed from a thin amorphous metal work material.

In one aspect the present invention is a ground fault current interrupter device utilizing a single laminated ring magnetic core transformer formed from a plurality of high velocity punch pressed amorphous metal or nanocrystalline soft magnetic laminations as the sensor for both the current imbalance winding and the low impedance ground fault winding.

In another aspect the present invention is a current imbalance protection device wherein the current imbalance sensing transformer is a laminated ring magnetic core transformer formed from a plurality of high velocity punch pressed amorphous metal, or nanocrystalline soft magnetic laminations.

These and other aspects of the invention are set forth in this specification.

BRIEF DESCRIPTION OF THE DRAWINGS

The foregoing brief summary, as well as the following detailed description of the invention, is better understood when read in conjunction with the appended drawings. For the purpose of illustrating the invention, there is shown in the drawings exemplary forms of the invention that are presently preferred; however, the invention is not limited to the specific arrangements and instrumentalities disclosed in the following appended drawings.

DETAILED DESCRIPTION

Figure 1:
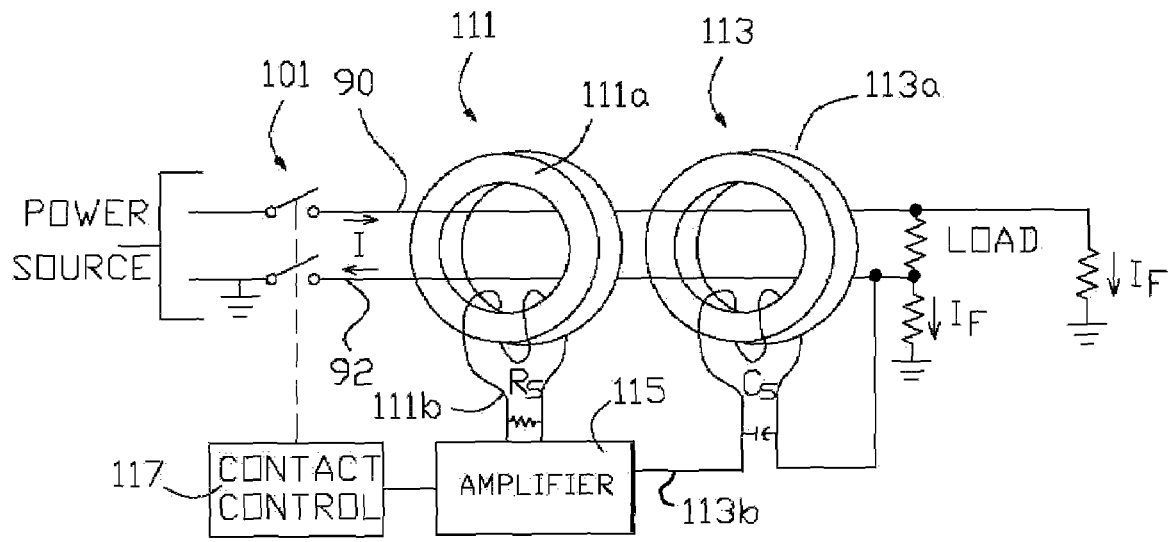
FIG. 1 is a simplified circuit diagram for a typical ground fault current interrupter.

According to one aspect of the invention, a leakage current protection device is provided with a differential current sensing magnetic ring core comprising a stack of amorphous metal laminate blanks.

According to another aspect of the invention, the improved magnetic properties provided by employing an amorphous metal laminate stack as the differential core, are exploited by using the same said core to couple the oscillation of a neutral-ground low impedance to the differential core, and thereby provide a sufficient signal to the amplifier and threshold detection circuits to trigger decoupling of the circuit from the power mains in the event of either differential current in excess of a predetermined threshold or neutral-to-ground impedance below a predetermined threshold.

According to a preferred embodiment, the amorphous metal specifically comprises a nanocrystalline material, and the magnetic cores are formed as laminated axially stacked annular ring shapes that are punched from a thin amorphous metal strip.

A laminated magnetic core is formed from a stack of ring laminations by blanking an amorphous metal sheet, strip or ribbon in a high velocity punch press. The laminations as thus formed are processed and assembled to provide magnetic cores.

One suitable method for forming the amorphous metal strip is by melt spinning on a super cooled fast spinning wheel. One type of such amorphous metal strip is known as METGLAS® and is available from Metglas, Inc. Conway, S.C. The amorphous metal strip may be annealed prior to stamping to form a nanocrystalline soft magnetic ribbon.

The amorphous metal is generally characterized by a structure of fine grains as opposed to a highly crystalline metal mass. The material can be made by cooling molten metal faster than the metal can crystallize.

A suitable example of a nanocrystalline soft magnetic strip is described in U.S. Pat. No. 4,881,989 (the disclosure of which is incorporated by reference herein), and is available as FINEMET® from Hitachi Metals, Ltd., Tokyo, JAPAN. Preferably the amorphous metal strip used in the present invention has a thickness between approximately 0.0007 inch (17.78 μm) and 0.0010 inch (25.4 μm). FINEMET material is specified for certain inductors wherein a torus is formed by winding a continuous length of the soft metallic strip around a spool or the like. According to the present invention, a ring core is made by axially stacking punched rings of material from a strip.

FINEMET and other similar nanocrystalline Fe-based soft magnetic materials with high saturation flux density and low core loss are particular apt for providing a compact, low-cost differential current ring core. As disclosed herein, the ring core can be used for both differential current sensing functions and as the inductor in resonant tank circuit whereby the dormant oscillation of a neutral-ground impedance responsive circuit can be coupled to the differential current coil of a leakage current protection device. Only one coil is needed. The coil can be smaller and less expensive than nickel-iron compositions having comparable windings and/or the number of windings needed can be fewer.

Nanocrystalline material (e.g., FINEMET) is made from an amorphous (non-crystalline) ribbon obtained by rapid quenching, for example at one million degrees C. per second from a molten metal. The molten mix can include Fe, Si, B and small amounts of Cu and Nb. The crystallized alloy has extremely uniform and small grains, about ten nanometers in size. Amorphous metals, particularly with alloy elements have superior soft magnetic properties due to crystallization. It has been reported that larger crystal grains yield good soft magnetic properties. Small grain (nanocrystalline) materials also have excellent properties.

Amorphous metal and more particularly nanocrystalline amorphous metal materials such as FINEMET have high saturation magnetic flux density comparable to Fe-based amorphous metal, and high permeability comparable to Co-based amorphous metal. The material has low magnetostriction, i.e., good immunity to mechanical stress. It is possible to control the shape of the B-H hysteresis curve by annealing a core in the presence of a magnetic field aligned in a circumferential direction to obtain an H-type squared hysteresis characteristic, or no field to obtain a nominal M-type characteristic, or a field vertical to the core plane to obtain an L-type slanted characteristic.

The absence of a high proportion of nickel results in low material expense. The advantageous magnetic properties allow the core to be compact. A compact core, or a core with fewer windings, may achieve electrical circuit operational characteristics that are as good or better than a larger core with more windings using more conventional materials and elements.

A suitable punch press for stamping the laminations is described in U.S. Pat. Nos. 5,113,736 and 5,245,904 (also hereby incorporated by reference). The punch press is generally referred to herein as an electromagnetic punch press. Referring to the element numbers in these patents, female die (32), and male die (34) (see FIG. 1 in both the '736 and '904 patents), correspond to die 32 and punch 34, respectively, in attached FIG. 3(a), which represent one non-limiting example of a punch and die combination that can be used in the electromagnetic punch press to stamp, for example, ring lamination 36 in attached FIG. 3(b) from amorphous metal strip 38. The punch and die combination, shown generally as telescopically engaged cylindrical elements, can be arranged as in U.S. Pat. No. 6,311,597 and/or can be mounted for movement on relatively movable press elements as is U.S. Pat. Nos. 6,941,790 or 7,114,365. The disclosures of these patents are likewise incorporated herein, in their entireties.

Work material "W", which in the present invention can be an amorphous metal strip or a nanocrystalline soft metal strip, is suitably fed into the die set (30) of the two referenced patents. Independent self-centering pilots can be included to locate the strip accurately in the die prior to stamping.

By stamping the laminations from the amorphous metal strip using accurately dimensioned punch and die element that are accurately guided, the amorphous metal strip material can be sheared with minimal fracturing along the inner and outer edges of each ring lamination. This is achieved in part by use of a stamping tooling with punch die clearance of about 10% of the material thickness, per side, and utilizing a die set comprising a large reciprocating bearing as described in U.S. Pat. No. 6,311,597. This structure allows mounting of punch components inside the inner race and mounting the die components to the outer race.

Operating the punch press at relatively high operational velocities, for example 7 to 12 feet per second, with a stamping apparatus arranged with a reciprocating bearing for guidance and the 10% clearance mentioned, it has been found that an amorphous strip with a thickness between about 17.78 µm and 25.4 µm can be produced with advantageous characteristics. The outer and inner diameters may be varied to obtain the desired electrical and magnetic characteristics. In one embodiment, the maximum outer radius of a ring core is approximately 1.675" and the minimum inner diameter of a ring core is approximately 0.010".

Figure 3A:
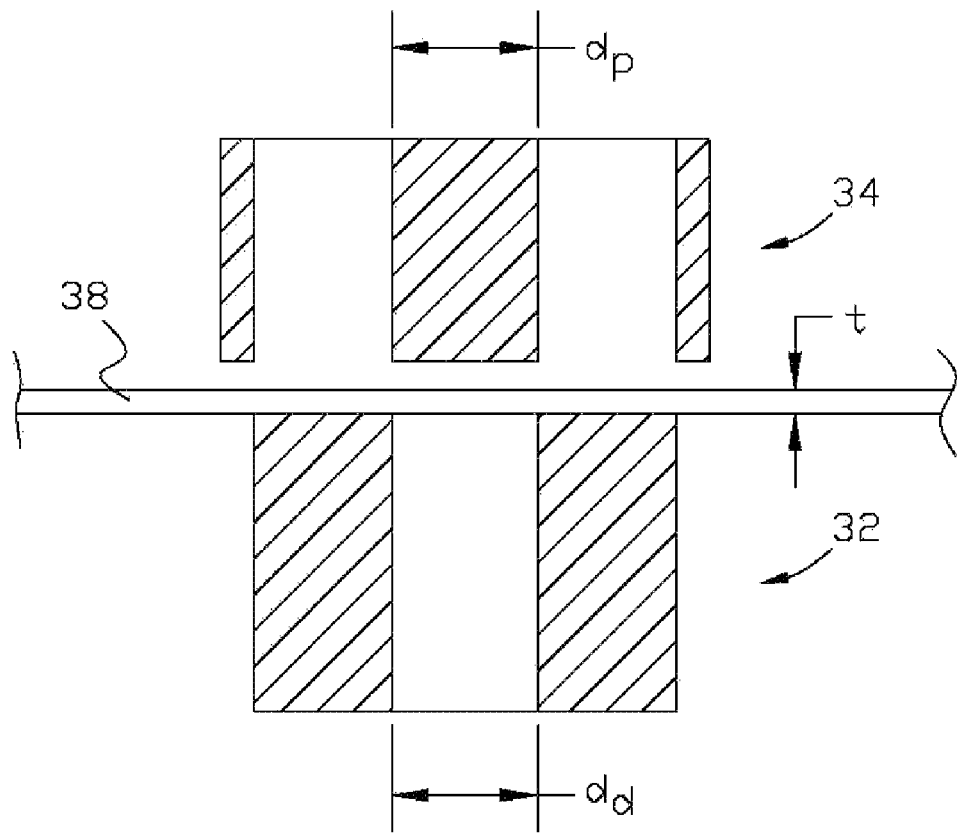
FIG. 3(a) illustrates one example of a punch and die combination that can be used with the punch press for producing ring laminations for a laminated magnetic core of the present invention.
Figure 3B:
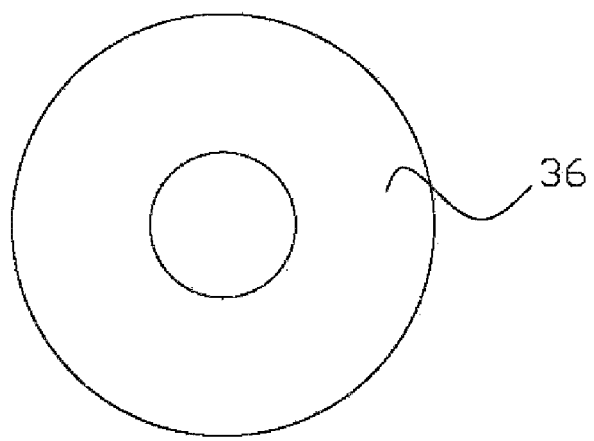
FIG. 3(b) illustrates a ring lamination produced from the punch and die combination in FIG. 3(a).

The punch-die clearance, which is relatively tight as thus specified, is defined as a relative clearance, per side, in percent of the material thickness, and is represented by the equation:

$$c = \frac{d_d - d_p}{2t} \cdot 100 \text{ percent,}$$

where c equals radial clearance in percent;

$d_d$ equals the diameter of the die (refer to FIG. 3(a));

$d_p$ equals the diameter of the punch (refer to FIG. 3(a)); and t equals the thickness of the material (refer to FIG. 3(a)).

Stamped laminations 36 ejected from punch press can be guided (e.g., dropped by gravity) onto a pin or spindle and carried on suitable conveyors to collect and advances a predetermined number of laminations in stacks along a processing direction to assemble a core.

Heat treatment optionally can be applied after stamping the laminations to anneal the amorphous metal material. In that case, the laminations 36 can be heat treated before or after collection into stacks. Heat treating can be accomplished, for example, by conveying either stacked laminations on spindles or individual laminations on a guide rod, through a tunnel oven or through an electric induction heater. In one embodiment, the laminations are heat treated in a nitrogen atmosphere at a temperature between 700 degrees Fahrenheit and 1080 degrees Fahrenheit for approximately twenty minutes to about two hours. The nitrogen environment is replenished at 400 standard cubic feet per hour. Heat treating the laminates helps develop the crystalline structure and thus develop the desirable electrical and magnetic properties of the laminates. Accordingly, adjusting the temperature and duration of the heat treatment will adjust the electrical and magnetic properties of the laminates.

After heat treatment (or after punching, if heat treatment is not required), a vibration dampening agent, such as light oil, optionally can be applied to the laminations, for example, using a spray apparatus. This treatment is useful to dampen electromechanical vibration of the laminations when ac current is applied to an assembled magnetic core.

A stack containing the required number of laminations 36 is mounted in an electrically non-conductive container as a finished core. The number of laminations will vary on the desired electrical and magnetic characteristics of the finished magnetic core. The laminations can be placed in a nonconductive container such as a plastic case, which is potted or capped to seal the container. Other materials may be used for the nonconductive container including, but not limited to, glass filled nylon, aluminum epoxy, and polyurethane. Alternatively, the stack of laminations can be transferred to a suitable encapsulation apparatus for encapsulation in a nonconductive coating or encapsulating material. In one embodiment, the nonconductive container is sized such that the stacked laminates may move within the container.

The magnetic cores can be subjected to an electrical test process along the process for automated selection and rejection of cores according to a desired specification. For example, the magnetic cores may be accepted or rejected according to their impedance permeability. Preferably, testing and selection are accomplished after the cores are packaged in containers or encapsulated so as to represent the finished product. The cores can be coupled between a coil applying an exciting signal and a coil coupled to suitable test equipment (not shown) to assess whether the response to the excitation is within predetermined tolerances.

Figure 2:
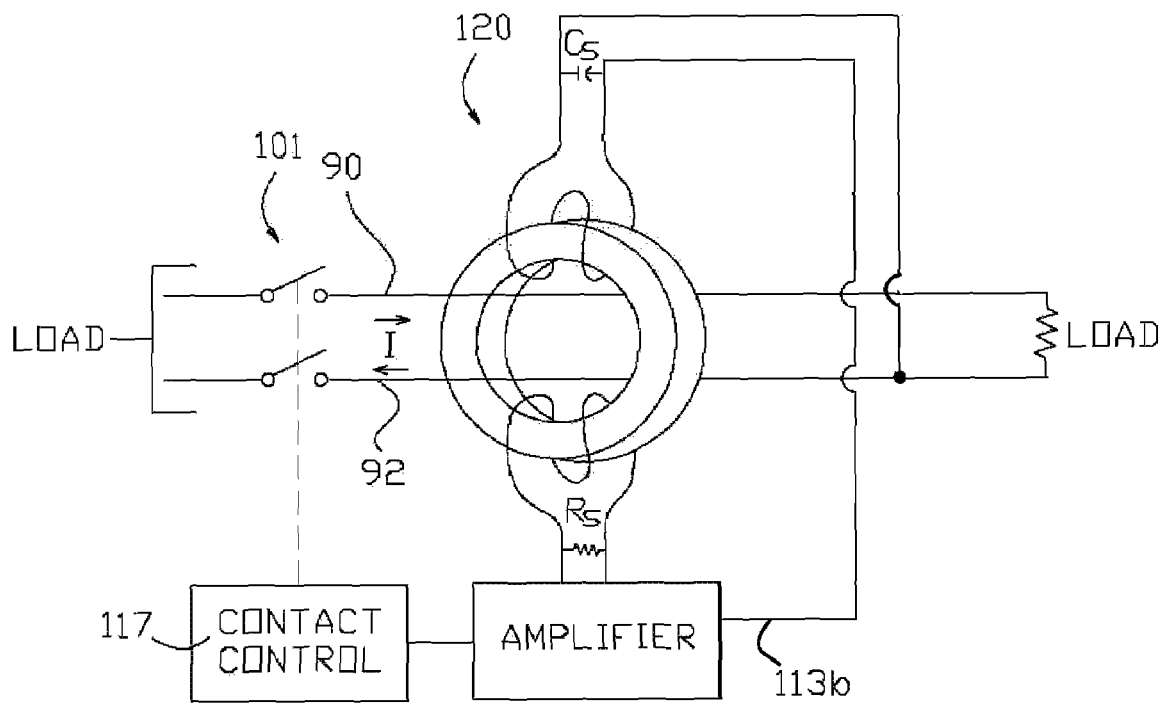
FIG. 2 is a simplified circuit diagram of one example of a leakage current protection device of the present invention configured as a ground fault circuit interrupter.

In assembling the electric circuit shown in FIG. 2, the amorphous laminate coil core is used for continuously sensing both differential current levels over a threshold, and neutral-to-ground impedance below a threshold. An amplifier 113b and contact control 117 substantially as already known are coupled respectively to the secondary windings. The secondary winding for differential current sensing includes a parallel resistor $R_S$. This winding is of approximately 500 turns to approximately 2000 turns.

Instead of coupling a resonant ground fault winding to a separate ferrite ring core, according to the invention, a second secondary winding is coupled to the amorphous metal ring core. The secondary winding for ground fault detection can have approximately 150 to 300 turns. A parallel capacitance $C_S$ provides a resonant tank with the inductance of the secondary winding and also couples such resonance through the ring core to the differential current sensing input of amplifier 113b. As a result, the circuit functions in a manner similar to a two core device as in FIG. 1.

The amorphous metal laminate stack core as described has substantially improved magnetic properties compared to a second ferrite ring core. For example, a finished magnetic ring core formed from the amorphous nanocrystalline material has a permeability of approximately 160,000H/m when operating at a flux density of 40G and at a frequency of 60 Hz, which is approximately eleven times the permeability of a conventional ferrite ring core (15,000 H/m) operating under the same conditions. The amorphous metal laminate stack core also has improved magnetic properties compared to a second 80% nickel ring core. For example, the permeability of the amorphous nanocrystalline material has a permeability of approximately four times the permeability of an 80% nickel ring core (40,000 H/m) when operating at flux density of 40 G and a frequency of 60 Hz. Additionally, the saturation flux density of the amorphous nanocrystalline ring core (12,000 G) is approximately twice as high as the saturation flux density of an eighty percent nickel ring core (6,000 G) and is operable over a wider thermal range −50 C to 150 C than the nickel alloy (−35 C to +70 C).

The use of thin amorphous metal as described herein achieves a substantial cost saving in the lamination material, compared to alternative materials. According to the invention, a cylindrically guided or similarly precise punch press can produce the laminations without undue incidence of fracturing along stamped edges. The invention is readily automated as described thereby reducing labor requirements, and by minimizing or eliminating handling, further protects the fragile laminations from damage.

Moreover, by employing amorphous metal material, and more preferably a nanocrystalline amorphous metal material, raw material costs are lower and less volatile than magnetic materials with a substantial proportion of nickel. The compactness of a current leakage protection circuit is improved because the ring core can be small and requires fewer windings. These aspects reduce material expense and production time. According to the invention, the ground to neutral core is entirely eliminated without loss of the ability to sense low neutral-to-ground impedance conditions. Unlike complicated and expensive switched circuits that shift between current imbalance sensing and ground/neutral fault sensing functions, the disclosed device simultaneously and continuously monitors for both such conditions.

The foregoing disclosure describes a number of embodiments and alternatives, but these are intended as examples. The invention is not limited to the arrangements disclosed as examples demonstrating the subject matter, and is capable of embodiment in other ways consistent with this disclosure.

What is claimed is:

1. A leakage current protection device, comprising:
    a magnetic ring core including one or more amorphous metal laminates disposed in an electrically nonconductive container;
    a first secondary winding coupled to the magnetic ring core, the first secondary winding having a first number of turns; and
    a second secondary winding coupled to the magnetic ring core, the second secondary winding having a second number of turns,
    wherein the magnetic ring core is configured to continuously sense both differential current levels and ground fault conditions.

2. The leakage current protection device of claim 1, further comprising:
    an amplifier coupled to the first and second secondary windings; and
    a contact control connected to the amplifier and a contact, the contact control configured to open the contact if a differential current level is above a threshold level and/or a ground fault impedance is below a threshold level.

3. The leakage current protection device of claim 1, wherein the amorphous metal laminates are nanocrystalline amorphous metal laminates.

4. The leakage current protection device of claim 1, wherein the amorphous metal laminate has a thickness between approximately 17.78 µm and 25.4 µm.

5. The leakage current protection device of claim 1, wherein the second secondary winding includes about 150 turns to about 300 turns.

6. The leakage current protection device of claim 1, wherein the first secondary winding includes about 500 turns to about 2,000 turns.

7. The leakage current protection device of claim 2, wherein the first secondary winding includes a parallel resistor for differential current sensing.

8. The leakage current protection device of claim 7, wherein the second secondary winding has a parallel capacitance for ground fault detection.

9. A leakage protection device comprising:
    a ring-shaped magnetic core, the ring-shaped magnetic core including one or more amorphous metal laminates disposed in an electrically nonconductive container, the ring-shaped magnetic core defining an aperture through which a first primary winding and a second primary winding extend;
    a first secondary winding coupled to the ring-shaped magnetic core, the first secondary winding configured to sense differential current levels in the first and second primary windings; and
    a second secondary winding coupled to the ring-shaped magnetic core, the second secondary winding configured to detect a ground fault in the first and second primary windings.

10. The leakage protection device of claim 9, wherein the one or more amorphous metal laminates are nanocrystalline amorphous metal laminates.

11. The leakage current protection device of claim 10, wherein the one or more amorphous metal laminates have a thickness between approximately 17.78 µm and 25.4 µm.

12. The leakage current protection device of claim 9, wherein the second secondary winding includes about 150 turns to about 300 turns.

13. The leakage current protection device of claim 9, wherein the first secondary winding includes about 500 turns to about 2,000 turns.

14. The leakage current protection device of claim 9, further comprising:
    an amplifier coupled to the first secondary winding and the second secondary winding.

15. The leakage current protection device of claim 9, wherein the first secondary winding includes a parallel resistor for differential current sensing.

16. The leakage current protection device of claim 9, wherein the second secondary winding has a parallel capacitance for ground fault detection.

* * * * *